(12) United States Patent
Rubino (10) Patent No.: US 11,837,976 B2
(45) Date of Patent: Dec. 5, 2023

(54) FLOW ENERGY HARVESTING SYSTEM WITH COUPLED PIEZOELECTRIC DEVICES AND FLOW DISRUPTORS

(71) Applicant: WiSys Technology Foundation, Inc., Madison, WI (US)

(72) Inventor: Edoardo Rubino, Platteville, WI (US)

(73) Assignee: WiSys Technology Foundation, Inc., Madison, WI (US)

( * ) Notice: Subject to any disclaimer, the term of this patent is extended or adjusted under 35 U.S.C. 154(b) by 380 days.

(21) Appl. No.: 17/205,880

(22) Filed: Mar. 18, 2021

(65) Prior Publication Data

US 2021/0297014 A1 Sep. 23, 2021

Related U.S. Application Data

(60) Provisional application No. 62/991,789, filed on Mar. 19, 2020.

(51) Int. Cl.
*H02N 2/18* (2006.01)
*H10N 30/30* (2023.01)
*H10N 30/88* (2023.01)

(52) U.S. Cl.
CPC .......... *H02N 2/185* (2013.01); *H10N 30/306* (2023.02); *H10N 30/886* (2023.02)

(58) Field of Classification Search
CPC ..... H02N 2/185; H10N 30/306; H10N 30/886
See application file for complete search history.

(56) References Cited

U.S. PATENT DOCUMENTS 9,531,303 B2 * 12/2016 Sherrit ................... H02N 2/185

* cited by examiner

*Primary Examiner* — Emily P Pham
(74) *Attorney, Agent, or Firm* — Boyle Fredrickson, S.C.

(57) ABSTRACT

An energy harvesting system can be used to exploit freely available flow energy with a piezoelectric device(s). The system may include a piezoelectric device and a flow disruptor, such as a blunt body that creates flow turbulence and flow characteristic randomization that can increase movement response from the piezoelectric device and enhance electrical power generation. Multiple piezoelectric devices may be linked to each other to enhance movement of a less-influenced piezoelectric device from translated movement of a more-influenced piezoelectric device and create more electrical power than a single piezoelectric device subjected to the same flowing fluid.

14 Claims, 6 Drawing Sheets

FLOW ENERGY HARVESTING SYSTEM WITH COUPLED PIEZOELECTRIC DEVICES AND FLOW DISRUPTORS

CROSS REFERENCE TO RELATED APPLICATION

This application claims the benefit of U.S. Provisional Application No. 62/991,789 filed Mar. 19, 2020, which is incorporated herein by reference in its entirety.

FIELD OF THE INVENTION

The invention relates generally to renewable energy.

BACKGROUND OF THE INVENTION

Efforts are increasing to address energy problems by utilizing renewable resources to produce electricity. Advances in technologies to produce electricity from renewable resources look promising, yet they can have drawbacks. Harvesting wind energy is typically done with wind turbines, which require large initial capital investments and have massive rotating components that need frequent inspections and substantial labor-intensive and expensive maintenance. Although harvesting solar energy through solar panels requires lower initial costs and less maintenance than wind turbines, they are only effective during daylight hours and their performance can be compromised by sun-blocking weather conditions. Recent efforts have been made to harvest energy using piezoelectric materials that can generate voltages when deformed. Some of these attempts include incorporating piezoelectric materials that can be periodically flexed by people throughout their daily lives, such as incorporating piezoelectric materials into clothing. These implementations are small in scale and are correspondingly limited in how much electricity they can produce. Plus, material-implemented piezoelectric energy harvesting systems require their wearers to be active and present challenges of, for example, storing electrical energy without bulky accessories.

SUMMARY OF THE INVENTION

The present inventor has determined that an energy harvesting system can be used to exploit freely available flow energy with a piezoelectric device(s). Sources of freely available flow energy may include natural or environmental flow energy sources such as wind, oceanic tides or other water currents to flex piezoelectric devices. Industrial or other human-produced flow energy can also be used, such as industrial exhaust or other systems that produce flowing volumes of gasses or liquids to flex piezoelectric devices.

Specifically, according to one aspect of the invention, a flow energy harvesting system is provided to produce electrical power from flow energy. The system may include a piezoelectric device and a flow disruptor. The flow disruptor may be arranged upstream of the piezoelectric device and create a disruption within a fluid flow path that produces more movement of the piezoelectric device than an undisrupted flow of the fluid directly into the piezoelectric device.

It is thus a feature of at least one embodiment of the invention to provide a system that enhances energy production by piezoelectric devices placed in fluid flow paths that are disturbed to stimulate additional movement of the piezoelectric devices through turbulence or varying pressure(s) of the flowing fluid. By enhancing flexing tendencies of piezoelectric devices from freely flowing fluids, low cost electrical power producing devices with no rotating parts can be provided.

According to another aspect of the invention, a flow disruptor upstream of the piezoelectric device may be defined by a blunt body with a random or irregular profile shape presented to the flowing fluid.

It is thus a feature of another embodiment of the invention to provide a low-cost passive structure that can enhance the electrical power output from the piezoelectric device.

According to another aspect of the invention, a coupler may connect multiple piezoelectric beams to each other to define oscillators that translate motion between them.

It is thus a feature of another embodiment of the invention to translate mechanical energy from a first piezoelectric beam to another to capture kinetic energy to produce additional electrical energy that would otherwise be wasted through internal material damping of a single piezoelectric beam.

These and other features and aspects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the scope of the invention.

BRIEF DESCRIPTION OF THE DRAWINGS

Various exemplary embodiments of the subject matter disclosed herein are illustrated in the accompanying drawings in which like reference numerals represent like parts throughout, and in which.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE PREFERRED EMBODIMENTS

Figure 1:
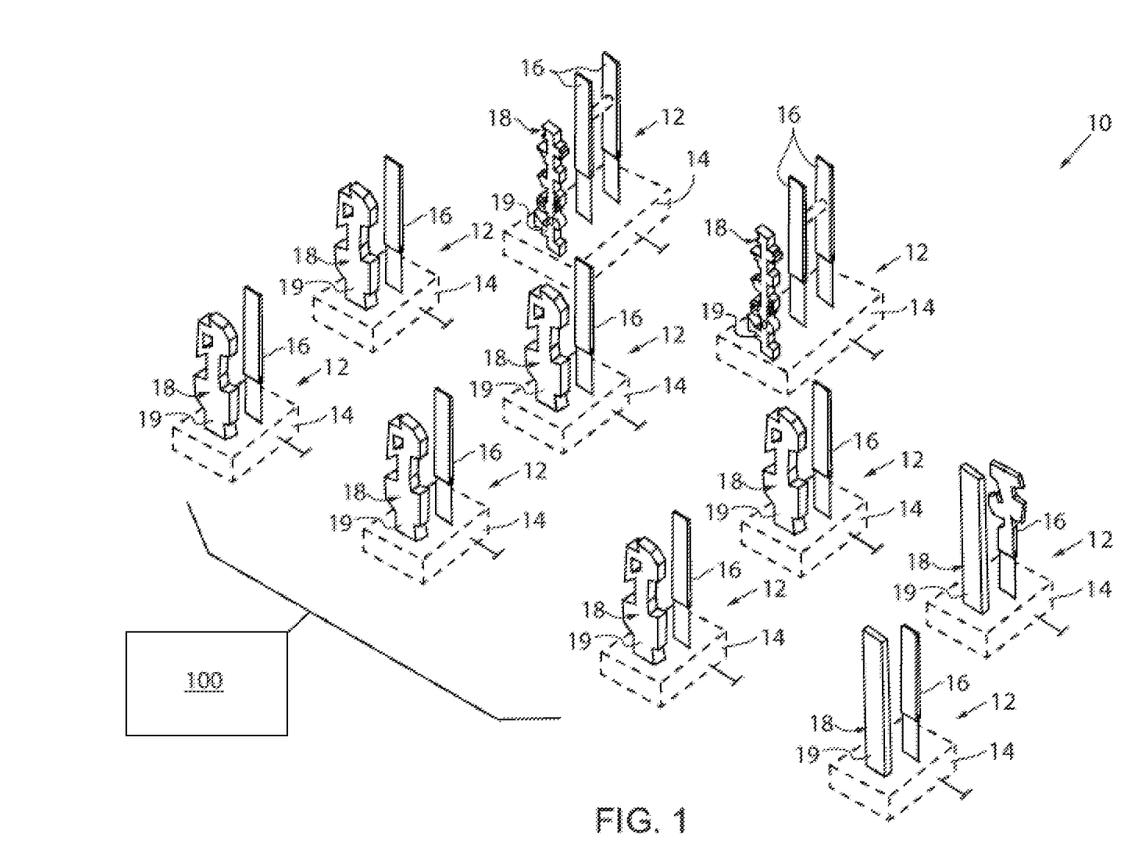
FIG. 1 is a partially schematic representation of an energy harvesting system in accordance with an aspect of the invention.

Referring now to the drawings and initially to FIG. 1, an energy harvesting system 10 is shown as an array of multiple energy harvesting arrangements 12 that convert mechanical energy of flowing fluids into electrical energy. Each energy harvesting arrangement 12 is shown with a base 14 that supports at least one piezoelectric device 16 placed within a flowing fluid that flexes the piezoelectric device 16 to produce the electrical energy. Energy harvesting system 10 is shown here as a wind energy harvesting system, with base 14 mounted to a substrate. The substrate to which base 14 is mounted may be the ground or an elevated stand in an open area. In such example(s), energy harvesting system 10 may be suitable for use in, for example, rural or other open-area applications. The mounting substrate may instead be on or between buildings when used in urban or other confined-area applications. Wind energy implementations can use other forms of flowing gasses, such as those inside factory chimneys for industrial applications that utilize flowing gasses that are generated as part of industrial activity. In these implementations, the mounting substrate may be an inner surface of the chimney or an upper edge that defines the chimney's opening. It is understood that the energy harvesting system 10 may be used with liquid providing the motive force to flex the piezoelectric device 16, such as oceanic or other water currents, tides, or flowing industrial or other liquids within industrial processing facilities or other facilities that use flowing liquids.

Still referring to FIG. 1, each energy harvesting arrangement 12 is shown with a flow disruptor 18 that is arranged upstream of the respective piezoelectric device 16. Flow disruptor 18 creates a disturbance in the flow path of the flowing fluid that provides the motive force to move the piezoelectric device 16, producing an electrical voltage in or electrical power through the piezoelectric device 16. Each flow disruptor 18 is shown here as a post 19 that is mounted to the substrate and positioned adjacent its corresponding piezoelectric device 16. Typically, the longitudinal axis of the piezoelectric device 16 and the longitudinal axis of the post 19 are parallel to each other so the piezoelectric device 16 and the post 19 and are spaced from, parallel to, and aligned with each other, with the piezoelectric device 16 behind the post 19. The piezoelectric devices 16 and posts 19 are shown here with thickness dimensions that are less than each of their height and width dimensions. The spacing between each piezoelectric device 16 and its paired post 19 is typically a distance that is greater than the thickness dimension of either one of the piezoelectric device 16 and the post 19 and may be a distance that is less than the height dimension of either of the piezoelectric device 16 and the post 19, explained in greater detail elsewhere.

Figure 2:
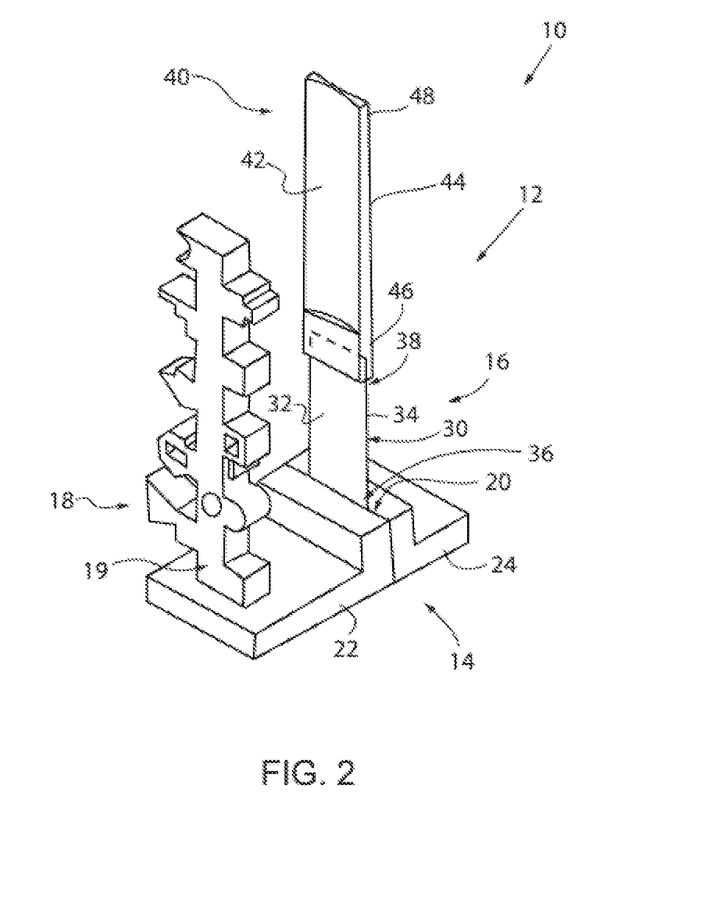
FIG. 2 is a pictorial view of an energy harvesting arrangement of the energy harvesting system of FIG. 1.

Referring now to FIG. 2, base 14 provides a piezoelectric device holder 20 and is shown here with a multi-piece configuration, including first and second brackets as upstream and downstream brackets 22, 24. Each of the upstream and downstream brackets 22, 24 is shown with a generally L-shaped configuration, with horizontal segments and upright segments. In this example, vertical walls of the upright segments abut each other to define a clamp as the piezoelectric device holder 20 that holds a lower end of the piezoelectric device 16, extends upwardly away from base 14. In this way, the piezoelectric device 16 is cantilevered from base 14.

Still referring to FIG. 2, piezoelectric device 16 is shown here having a piezoelectric beam 30. Examples of suitable piezoelectric beams 30 are available from Midé Engineering Solutions, such as those within its PPA (Piezo Protection Advantage) product lines, which may have a single piezo layer, multiple piezo layers, or other configurations and on various substrates, selected depending on the particular end-use environment. Size(s) of the piezoelectric beams 30 are also selected based on the end-use environment. An exemplary piezoelectric beam 30 suitable for implementation in energy harvesting system 10 is Midé Engineering Solutions' PPA 1011 with a single layer configuration with its PZT-5H piezo material, a capacitance of about 97 nF, a mass of 3.0 grams, an overall length of 2.8 in (71 mm), an overall width of 1.63 in (41.5 mm), an overall thickness of 29.5 mils (0.75 mm), a piezo length of 1.81 in (46 mm), a piezo width of 0.82 in (20.8 mm), and a piezo thickness of 6.0 mils (0.18 mm). Examples include incorporating piezoelectric beams 30 with frontal areas of about 10 $cm^2$ or less. Compact installations may implement piezoelectric beams 30 with frontal areas of less than 5 $cm^2$. Examples of compact installations may include mounting directly to buildings, such as incorporating the energy harvesting system 10 into building facades in urban applications or mounted inside factory chimneys, without compromising chimney emissions in industrial applications. Piezoelectric beam 30 has a beam body that is relatively thin and generally planar with a rectangular perimeter shape. The beam body has a first side that defines a beam upstream side 32 that faces toward the flow disruptor 18 and defining the frontal area of the piezoelectric beam 30. A second side of beam body defines a beam downstream side 34 and faces away from the flow disruptor 18. A first end defines a beam body inner end 36 that is mounted to the piezoelectric device holder 20 and a second end defining a beam body outer end 38 is cantilevered with respect to the base 14.

Still referring to FIG. 2, piezoelectric device 16 is shown here with an extension 40 connected to and extending beyond the beam body outer end 38. Extension 40 is shown here defined as a blade that provides an extension body or blade body that extends generally linearly from the piezoelectric beam 30. Blade body of extension 40 has a longitudinal axis that is shown here coaxially aligned with a longitudinal axis of piezoelectric beam 30. The blade body may be dimensionally larger than the piezoelectric beam 30 to present a larger surface area to interact with the flowing fluid than the piezoelectric beam 30. A first side of the blade defines an extension body upstream side or a blade body upstream side 42 that faces toward the flow disruptor 18 and a second side defining an extension body downstream side or blade body downstream side 44 that faces away from the flow disruptor 18. Extension 40 is shown here with a non-planar surface(s) at its blade body upstream side 42 and also its blade body downstream side. These non-planar surfaces are shown as concave surfaces, with the blade body being thicker toward its outer edges and thinning toward a minimum thickness dimension at the blade center, extending along its length or height from a lower end socket that receives the beam body outer end 38. The concave surface provides a greater surface area compared to a planar surface of the same front/back elevation footprint and presents positions on its surface that face different directions, which may orthogonally receive flow fluid with different flow directions. A first end of extension 40 defines an extension body inner end or blade inner end 46 that is connected to the beam body outer end 38, which may include a socket or slot that receives the beam body outer end 38 into the extension blade inner end 46. A second end of extension 40 defines an extension body outer end or blade outer end 48 that is spaced from the piezoelectric beam 30. Although the extension 40 illustrated in FIG. 2 is shown as being symmetrical about its longitudinal axis, it is understood that the extension 40 may have an irregular shape, such as a blade body that is asymmetric relative to its longitudinal axis. An example of this can be seen as the upper piezoelectric device 16 in the pair of piezoelectric devices 16 toward the lower righthand corner of FIG. 1. Furthermore, in some implementations, the piezoelectric beams 30 themselves may be arranged with respect to each other in, e.g., close enough proximity and suitable alignment, so that an upstream piezoelectric beam (s) 30 may be flow disruptor 18 for a downstream piezoelectric beam(s) 30 that changes and enhances how the flowing fluid interacts with the downstream piezoelectric beam(s) 30.

Figure 3:
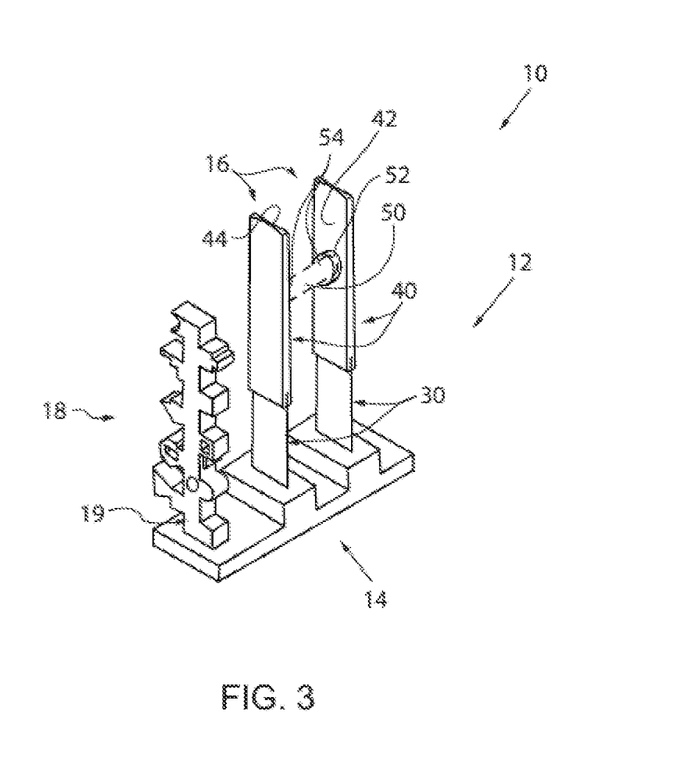
FIG. 3 is a pictorial view of a variant of the energy harvesting arrangement of FIG. 2.

Referring now to FIG. 3, piezoelectric device 16 may have multiple piezoelectric beams 30, which may be connected to each other, defining a coupled pair of piezoelectric devices. This piezoelectric device 16 is shown with two piezoelectric beams 30 aligned with and spaced from each other along a length or longitudinal axis of the base 14 and along an axis extending normal to the surfaces of the piezoelectric beams 30 that face each other so the piezoelectric beam 30 nearest flow disrupter 18 defines an upstream piezoelectric beam and the piezoelectric beam 30 furthest from the flow disrupter 18 defines a downstream piezoelectric beam. The upstream and downstream piezoelectric beams 30 may be spaced from each other by a distance of less than five-times a width dimension of each piezoelectric beam 30, such as a distance of about two-times a width dimension of each piezoelectric beam 30, plus or minus twenty-percent.

Still referring to FIG. 3, coupler 50 connects the pair of piezoelectric beams 30 to each other to translate motion between them so the piezoelectric beams 30 may define oscillators that collectively produce more electrical power than would a single piezoelectric beam subjected to the same flowing fluid. Couplers 50 may be implemented as pulling-type linkages that can be put into tension to translate movement of one piezoelectric beam 30 to the other. Such linkages may include flexible structures such as strings or other structures made from flexible materials that can pull the piezoelectric beam 30 that is downstream of the other, relative to the direction of deflection of the piezoelectric beam(s) 30. Couplers 50 may also be implemented as pushing/pulling-type linkages that can be put into tension or compression to translate movement of one piezoelectric beam 30 to the other. Such linkages may include rigid structures such as rods or other structures made from materials that are sufficiently rigid that may articulate at couplers 50 and be rigid to pull or push the piezoelectric beam 30 that is influenced more by the flowing fluid than the other, less influenced, piezoelectric beam 30. Other examples of linkages may be less rigid than rods but can instead be resilient linkages or at least somewhat deformable while still sufficiently rigid to pull or push the secondary or less-influenced piezoelectric beam 30 with the primary or more-influenced piezoelectric beam 30. These implementations may include a spring or other resilient connecting component as coupler 50. Another implementation of couplers 50 includes using electromagnetic forces instead of mechanical connections. This may include mounting a magnet on each of the piezoelectric beams 30 to either attract or repel each other or a magnet on one of the piezoelectric beams 30 and ferrous material on the other one of the piezoelectric beams 30 to magnetically urge the piezoelectric beams 30 toward each other.

Still referring to FIG. 3, regardless of the particular implementation of coupler(s) 50, the coupler(s) 50 typically joins the piezoelectric beams 30 to each other by way of the blades or extensions 40. Coupler seats 52 (only one visible in this view) may be incorporated into the respective upstream and downstream sides 42, 44 of blades or extensions 40 that face each other, such as the downstream side 44 of the forward or upstream piezoelectric beam 30 and the upstream side 42 of the rearward or downstream piezoelectric beam 30. Ends 54 of coupler 52 are connected to the coupler seats 52, affixing the ends 54 to the blades or extensions 40 for translation motion between them and correspondingly between the piezoelectric beams 30.

Figure 4:
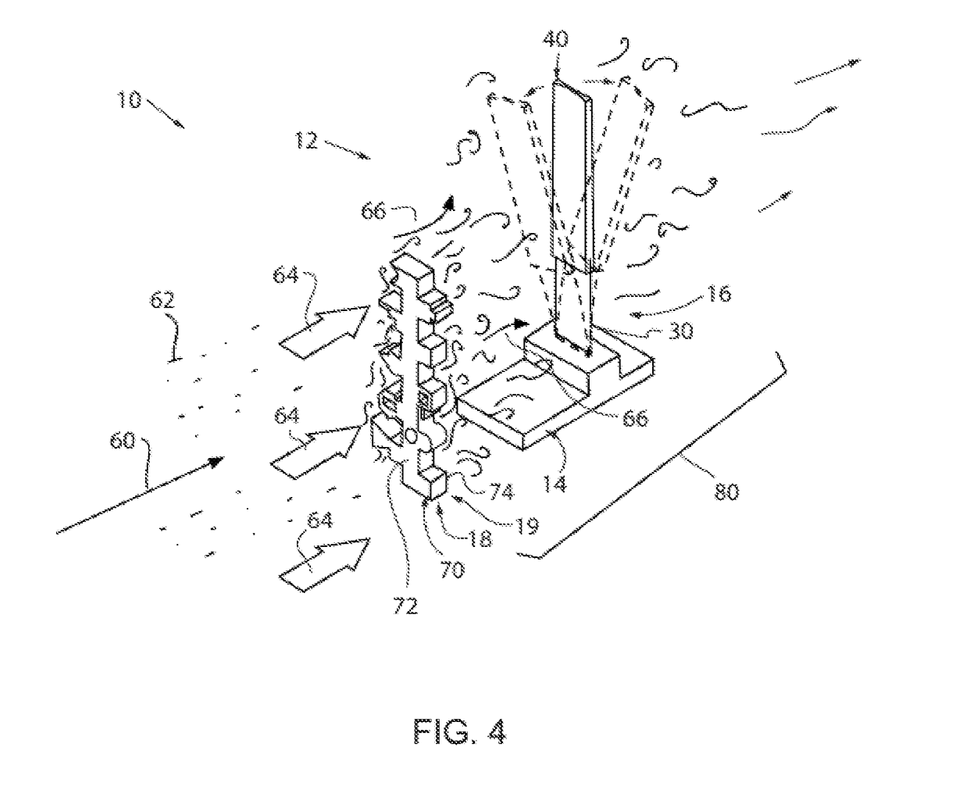
FIG. 4 is a pictorial view of variant of the energy harvesting arrangement of FIG. 2 being subjected to a flowing fluid.

Referring now to FIG. 4, flow disruptor 18 is arranged upstream of the piezoelectric device 16 to create a disturbance in a flow path 60 of the flowing fluid 62. Flow disruptor 18 and piezoelectric device(s) 16 may be aligned with each other so that their transverse planes are parallel to each other, with an axis that is normal to their respective facing surfaces extending perpendicularly between them. Flow disruptor 18 may have an overall width dimension that is greater than width dimensions of piezoelectric beam 30 and its extension 40 and an overall height dimension that is greater than a combined height dimension of piezoelectric beam 30 and its extension 40. The upstream flow disruptor 18 and downstream piezoelectric device(s) 16 may be spaced from each other by a distance of less than ten-times a width dimension of the piezoelectric device(s) 16, such as a distance of about three-times a width dimension of the piezoelectric device(s) 16, plus or minus twenty-percent. Flow path 60 defines an undisturbed flow segment 64 upstream of flow disruptor 18 and a disturbed flow segment 66 downstream of flow disruptor 18. The disturbed flow segment 66 is formed by the undisturbed flow segment 64 colliding with the flow disruptor, which changes the flow direction, turbulence, and/or other flow characteristics of the fluid 62. The disturbed flow segment 66 flows into the piezoelectric device 16 and presents, for example, more turbulence and/or pressure variations that flexes the piezoelectric device 16 and moves it more vigorously, for example into vibration or other oscillation, than would the relatively more stable undisturbed flow segment 64.

Referring still to FIG. 4, flow disruptor 18 may define a blunt body 70 that presents a substantial flow obstruction that can provide substantially random flow characteristics to the disturbed flow segment 66. The blunt body 70 may have inferior aerodynamic characteristics when compared to the piezoelectric device 16. Typically, blunt body 70 has a higher drag coefficient value than that of the piezoelectric device 16, for example, with the blunt body 70 having a drag coefficient of at least 1.0. This may be achieved with the blunt body 70 having an irregular shape, at least at its forward-facing surface(s), which may include multiple asymmetrical arms, lobes, protuberances, and/or apertures. Blunt body 70 may have forward and rearward facing sides or surfaces 72, 74 that define a thickness dimension them. Blunt body's 70 height may correspond at to a height of the piezoelectric device 16 so the disturbed flow segment 66 contacts or flows into substantially an entire forward-facing surface of the piezoelectric device 16. Forward facing side 72 defines a frontal area as its surface area that faces upstream toward the undisturbed flow segment 64. The irregular perimeter shape may provide asymmetry to the blunt body 70 about both a vertical axis and horizontal axis. This provides the blunt body 70 with a drag coefficient value is greater than that of a rectangular box that has the both the same thickness dimension and frontal area as the blunt body 70, making the blunt body 70 better at stirring up the flowing fluid than a more regular shaped structure. Although the blunt body 70 illustrated in FIG. 4 is shown with a random configuration or as being asymmetrical about its longitudinal axis, it is understood that it may have a simple or regular shape, such as a body that is symmetrical relative to its longitudinal axis. Examples of this can be seen as the pair of flow disruptors 18 or posts 19 toward the lower righthand corner of FIG. 1.

Still referring to FIG. 4, the highly stirred up fluid in the disturbed flow segment 66 provides turbulence, pressure pulses, and/or other flow variations or stimuli in a supplemental turbulence zone 80 that flexes or otherwise impart repeated movement to the piezoelectric device(s) 16 and for a greater duration than would otherwise be achieved by the piezoelectric device(s) 16 subjected to the undisturbed flow segment 64. The movement may be primarily bending moments of the piezoelectric device(s) 16, represented here as the dashed-line forms of piezoelectric device 16, and may also include twist or torsional moments of the piezoelectric device(s) 16. Enhanced movement of the piezoelectric device(s) 16 include at least one of a greater amplitude of deflection, a greater frequency of deflection, and/or a greater duration of deflection or longer time period of repeated movement. This enhanced movement of the piezoelectric device(s) 16 in the supplemental turbulence zone 80 allows the piezoelectric device(s) 16 to generate more electrical power when in the disturbed flow segment 66 than could be achieved in the undisturbed flow segment 64. Referring again to FIG. 3, coupled oscillator or multiple piezoelectric beams 30 implementations operate substantially the same way, only further transmitting motion to each other. The multiple piezoelectric beams 30 in energy harvesting arrangement 12 that are coupled to each other increase movement of the piezoelectric beam 30 that would otherwise move less than the piezoelectric beams 30 that is influenced by the flowing fluid 62 to a greater extent.

Referring again to FIG. 1 with background reference to FIG. 4, control system 100 is operably connected to the array of multiple energy harvesting arrangements 12 to convert their generated electrical power into a stored or otherwise usable form. Control system 100 may include, for example, a computer which may be an industrial computer or, for example, a PLC (programmable logic controller), along with corresponding software and suitable memory for storing such software and hardware including interconnecting conductors for power and signal transmission between components of the energy harvesting system 10. The computer(s) of control system(s) 100 executes various stored programs while receiving inputs from and sending commands to various components of energy harvesting system 10 to provide usable electrical power. Control system 100 may further include power conditioners to stabilize the input current and/or voltage into values that are acceptable for DC storage in batteries, which may then be inverted into an AC waveform. In some implementations, the electrical power from energy harvesting system 10 is both stored and used in DC form, whereby the energy harvesting system 10 may provide a DC power source. It is contemplated that instead of battery storage, energy harvesting system 10 may provide a DC power source as an alternative to batteries as power sources to provide power to, for example, consumer electronics or other DC powered devices that would typically use batteries as power sources.

Figure 5:
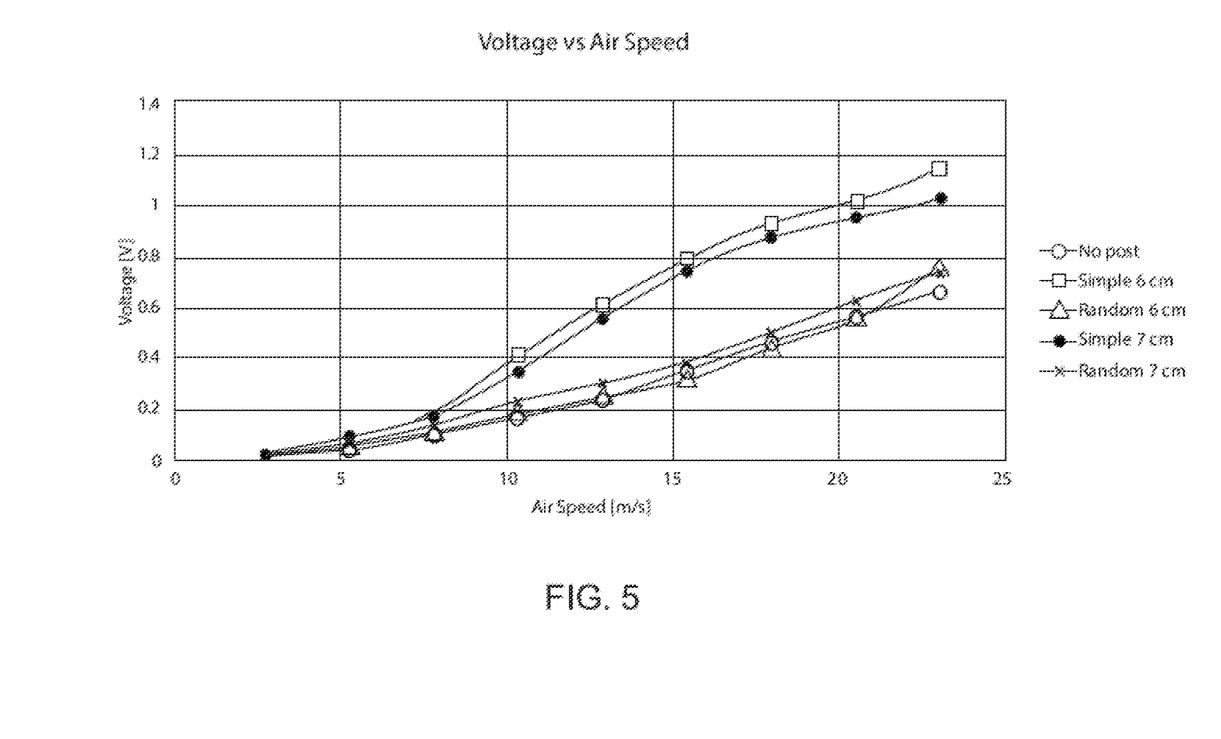
FIG. 5 is line graph representing performance characteristics of various energy harvesting arrangements as generated or output voltages as a function of air speed.

Referring now to FIG. 5, this graph shows examples of different performance characteristics of different system configurations of energy harvesting arrangements 12, realized during wind tunnel characterization testing. The testing occurred in a wind tunnel providing a tubular type enclosure with interconnected top, bottom, and side walls that define openings at front and back ends through which the air flows by, e.g., a pushing or pulling fan. The particular wind tunnel in these tests defined a test section or cross section of 15 inches by 15 inches and an entrance length of about 15.2 m. Testing occurred at an ambient temperature of approximately 18° C. The fluid system of the wind tunnel defined a Reynold's Number of 379,498.

Still referring to FIG. 5 and with background reference to FIGS. 1 and 2, the performance characteristics represented in this example were measured voltage output values of piezoelectric devices with and without various cooperating accessories or components, subjected to airflows of different velocities or speeds as representative fluid flows. In this particular example, no extensions 40 were implemented, but comparisons were made between different configurations of posts 19 as well as spacings between paired posts 19 and piezoelectric beams 30. Five measurements/evaluations were made. In the first evaluation(s), represented by the line with open circles, the measurement(s) was made with only the piezoelectric beam 30 and therefore with no post 19 positioned upstream of the piezoelectric beam 30 (without an extension 40). In the second evaluation(s), represented by the line with open squares, the measurement(s) was made with a simple post 19 (e.g., FIG. 1, bottom righthand corner) placed 6 cm upstream of the piezoelectric beam 30 (without extension 40). In the third evaluation(s), represented by the line with open triangles, the measurement(s) was made with a random post 19 placed 6 cm upstream of the piezoelectric beam 30 (without extension 40). In the fourth evaluation(s), represented by the line with closed circles, the measurement (s) was made with a simple post 19 (e.g., FIG. 1, bottom righthand corner) placed 7 cm upstream of the piezoelectric beam 30 (without extension 40). In the fifth evaluation(s), represented by the line with X's, the measurement(s) was made with a random post 19 placed 7 cm upstream of the piezoelectric beam 30 (without extension 40). In these particular evaluations, the best performance or highest voltage created was observed at the greatest tested airflow speed of 23.0173 m/s in the example with a simple post 19 spaced 6 cm upstream of its piezoelectric beam 30 provided the best performance. The second best performance or highest voltage created was also observed at the greatest tested airflow speed in the arrangement of the simple post 19 spaced 7 cm upstream of its piezoelectric beam 30. Table 1 shows data that underlies the graph of Voltage versus Air Speed, represented in FIG. 5.

TABLE 1

Voltage vs. Air Speed

Energy Harvesting Arrangement-Post Type

| | | 6 cm Post-Beam Spacing | | 7 cm Post-Beam Spacing | |
|---|---|---|---|---|---|
| Air Speed (m/s) | No Post (volts) | Random Shape (volts) | Simple Shape (volts) | Random Shape (volts) | Simple Shape (volts) |
| 2.7053 | 0.0169 | 0.0154 | 0.0238 | 0.018 | 0.0249 |
| 5.2443 | 0.0427 | 0.059 | 0.0871 | 0.0649 | 0.0908 |
| 7.7833 | 0.0992 | 0.1085 | 0.1818 | 0.1354 | 0.1721 |
| 10.3223 | 0.164 | 0.1792 | 0.4105 | 0.2292 | 0.3459 |
| 12.8613 | 0.236 | 0.2445 | 0.6089 | 0.3023 | 0.5568 |
| 15.4003 | 0.3495 | 0.3108 | 0.7895 | 0.3814 | 0.7434 |
| 17.9393 | 0.4615 | 0.4388 | 0.9289 | 0.4988 | 0.8743 |
| 20.4783 | 0.5602 | 0.5517 | 1.0162 | 0.6247 | 0.9521 |
| 23.0173 | 0.6621 | 0.7559 | 1.1449 | 0.7358 | 1.0283 |

Figure 6:
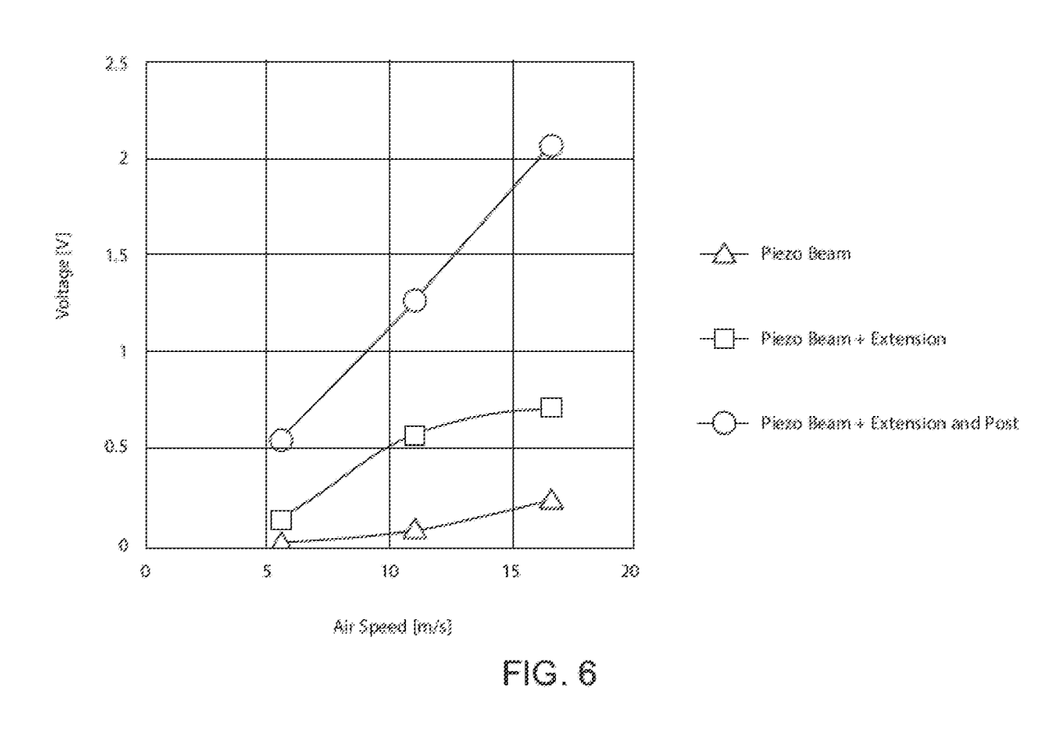
FIG. 6 is another line graph representing performance characteristics of various energy harvesting arrangements as generated or output voltages as a function of air speed.

Referring now to FIG. 6 and with background reference to FIGS. 1 and 2, this graph shows other examples of different performance characteristics of different system configurations of energy harvesting arrangements 12, realized during wind tunnel characterization testing using the same wind tunnel and testing protocols described with respect to the graph of FIG. 5. This example shows the greatest performance or highest voltage created at each of the airflow velocities was with a combination of a piezoelectric beam 30 (FIG. 2), extension 40 (FIG. 2), and post 19 (FIG. 2). Also at each of the airflow velocities, the combination of a piezoelectric beam 30 (FIG. 2) and extension 40 (FIG. 2) performed better than a piezoelectric beam 30 (FIG. 2) alone, without either an extension or cooperating post. Table 2 shows data that underlies the graph of Voltage versus Air Speed, represented in FIG. 6.

TABLE 2

Voltage vs. Air Speed

| Average Flow Velocity- Air Speed (m/s) | Piezo Beam Only (volts) | Piezo Beam and Extension (volts) | Piezo Beam, Extension, and Post (volts) |
|---|---|---|---|
| 5.52 | 0.019 | 0.14 | 0.554 |
| 11.04 | 0.087 | 0.576 | 1.271 |
| 16.56 | 0.241 | 0.719 | 2.069 |

Other aspects and characteristics of a flow energy harvesting system falling within the scope of the present invention are disclosed in the drawings.

Many changes and modifications could be made to the invention without departing from the spirit thereof. The scope of these changes will become apparent from the appended claims.

What is claimed is:

1. A flow energy harvesting system to passively produce electrical power during an energy harvesting session, comprising:
 a base providing a piezoelectric device holder;
 a piezoelectric device mounted to the piezoelectric device holder and extending into a flow path of a flowing fluid;
 a flow disruptor arranged upstream of the piezoelectric device with the flow disruptor creating a disturbance in the flow path of the flowing fluid, the flow disruptor defining:
  an undisturbed flow segment of the flowing fluid upstream before colliding with the flow disruptor;
  a disturbed flow segment of the flowing fluid downstream after colliding with the flow disruptor with the disturbed flow segment having more turbulence than the undisturbed flow segment with the disturbed flow segment colliding with and deflecting the piezoelectric device during the energy harvesting session to produce electrical power through the piezoelectric device.

2. The flow energy harvesting system of claim 1, wherein:
 the piezoelectric device defines a first drag coefficient value; and
 the flow disruptor defines a second drag coefficient value that is greater than the first drag coefficient value.

3. The flow energy harvesting system of claim 2, wherein the second drag coefficient value of the flow disruptor is at least 1.0.

4. The flow energy harvesting system of claim 3, wherein the flow disruptor defines a blunt body having:
 a thickness dimension;
 a frontal area as a surface area of the blunt body that faces upstream toward the undisturbed flow segment; and
 wherein:
  the second drag coefficient value of the blunt body is greater than that of a rectangular box having both the same thickness dimension and frontal area as the blunt body.

5. The flow energy harvesting system of claim 4, wherein the blunt body comprises:
 a main blunt body segment; and
 at least one lobe extending from the main blunt body segment to provide asymmetry to the blunt body.

6. The flow energy harvesting system of claim 5, wherein the blunt body is asymmetrical about both a vertical axis and a horizontal axis.

7. The flow energy harvesting system of claim 1, wherein during the energy harvesting session:
 introduction of the flowing fluid at a first velocity and in a first direction relative to the piezoelectric device deflects the piezoelectric device with deflection characteristics that include an amplitude of deflection, a frequency of deflection, and a duration of deflection from the disturbed flow segment colliding with the piezoelectric device with at least one of:
  a greater amplitude of deflection;
  a greater frequency of deflection; and
  a greater duration of deflection;
 when compared to the piezoelectric device being directly deflected by the undisturbed flow segment without the flow disruptor at the first velocity and in the first direction.

8. The flow energy harvesting system of claim 7, the piezoelectric device includes a piezoelectric beam providing a beam body having:
 a first side defining a beam upstream side facing toward the flow disruptor and a second side defining a beam downstream side facing away from the flow disruptor;
 a first end defining a beam body inner end that is mounted to the piezoelectric device holder of the base; and
 a second end defining a beam body outer end that is cantilevered with respect to the base.

9. The flow energy harvesting system of claim 7, wherein the piezoelectric device further comprises:
 an extension connected to and extending beyond the beam body outer end with the extension providing an extension body having:
  a first side defining an extension body upstream side facing toward the flow disruptor and a second side defining an extension body downstream side facing away from the flow disruptor;
  a first end defining an extension body inner end that is connected to the beam body outer end; and
  a second end defining an extension body outer end that is spaced from the beam body.

10. The flow energy harvesting system of claim 9, wherein:
 the extension provides a blade that extends generally linearly from the beam body,
 the blade includes a non-planar surface corresponding to the extension body upstream side.

11. A flow energy harvesting system to passively produce electrical power during an energy harvesting session, comprising:

a first piezoelectric device arranged in a flow path of a flowing fluid;

a second piezoelectric device in the flow path of the flowing fluid, downstream of the first piezoelectric device; and a coupler that connects the first and second piezoelectric devices to translate motion from one of the first and second piezoelectric devices to the other one of the first and second piezoelectric devices.

12. The flow energy harvesting system of claim 11, wherein:

each of the first and second piezoelectric devices is defined by a piezoelectric beam that is cantilevered from a base; and the coupled first and second piezoelectric beams define oscillators that transverse movement between each other.

13. The flow energy harvesting system of claim 12, wherein the coupler is defined by at least one of: a spring, a flexible string, a rigid bar, an elastic material, and a magnet.

14. The flow energy harvesting system of claim 11, wherein the first piezoelectric device and the second piezoelectric device that are connected with the coupler define a coupled pair of piezoelectric devices and the flow energy harvesting system further comprises:

a flow disruptor arranged upstream of the coupled pair of piezoelectric devices with the flow disruptor creating a disturbance in the flow path of the flowing fluid, the flow disruptor defining.

* * * * *